US009319099B2

(12) United States Patent
Demine et al.

(10) Patent No.: US 9,319,099 B2
(45) Date of Patent: Apr. 19, 2016

(54) ISOLATION REQUIREMENT MITIGATION FOR IDU-ODU INTERCONNECTIONS IN MICROWAVE SYSTEMS

(71) Applicant: Broadcom Corporation, Irvine, CA (US)

(72) Inventors: Serguei Demine, Nesher (IL); Hanan Leizerovich, Petah Tikva (IL); Yaacov Sturkovich, Netanya (IL)

(73) Assignee: Broadcom Corporation, Irvine, CA (US)

( * ) Notice: Subject to any disclaimer, the term of this patent is extended or adjusted under 35 U.S.C. 154(b) by 69 days.

(21) Appl. No.: 14/107,640

(22) Filed: Dec. 16, 2013

(65) Prior Publication Data

US 2015/0155953 A1 Jun. 4, 2015

Related U.S. Application Data

(60) Provisional application No. 61/910,639, filed on Dec. 2, 2013.

(51) Int. Cl.
*H04B 3/00* (2006.01)
*H04B 1/38* (2015.01)

(52) U.S. Cl.
CPC ......................................... *H04B 3/00* (2013.01)

(58) Field of Classification Search
CPC .............. H04B 1/10; H04B 1/23; H04B 1/38; H04B 1/40; H04B 3/23; H04B 3/232; H04B 3/235; H04B 3/237; H04B 3/32; H04B 15/00; H04B 15/02; H04B 15/025; H04B 3/00; H04L 25/0328; H04L 25/03821; H04L 27/367; H04L 27/368
USPC ......... 375/219, 220, 222, 254, 259, 268, 269, 375/271–273, 284, 285, 296, 340, 343, 344, 375/346, 350; 370/278, 282, 286, 289, 290, 370/291; 455/501, 63.1, 67.13, 570, 114.2, 455/114.3

See application file for complete search history.

(56) References Cited

U.S. PATENT DOCUMENTS

| | | | | |
|---|---|---|---|---|
| 8,422,540 B1 * | 4/2013 | Negus | ...................... | H04B 1/38 370/210 |
| 2011/0085477 A1 * | 4/2011 | Schiff | ................ | H04B 7/15585 370/279 |
| 2013/0077502 A1 * | 3/2013 | Gainey | ............... | H04B 7/15578 370/252 |
| 2013/0294295 A1 * | 11/2013 | Viswanathan | ......... | H04B 1/525 370/278 |
| 2014/0194071 A1 * | 7/2014 | Wyville | ................. | H04B 1/525 455/73 |
| 2014/0269991 A1 * | 9/2014 | Aparin | ................. | H04B 1/0475 375/297 |
| 2015/0092822 A1 * | 4/2015 | Petrovic | ................. | H04B 1/525 375/219 |

* cited by examiner

*Primary Examiner* — Young T Tse
(74) *Attorney, Agent, or Firm* — Sterne, Kessler, Goldstein & Fox P.L.L.C.

(57) ABSTRACT

A system and method to reduce and/or eliminate interference between an indoor unit (IDU) and an outdoor unit (ODU) in a split backhaul architecture. The interference can be present in, for example, an N-plexer in the IDU and/or the ODU. For example, interference on an outbound signal that is introduced by an inbound signal in the N-plexer can be reduced and/or eliminated by introducing a cancellation signal that is combined with the outbound signal. Further, the N-plexer can include two or more signal cancellation modules configured such that the output of a first signal cancellation module is connected to both a common pathway and the input of the second signal cancellation module. The input of the first signal cancellation module and the output of the second signal cancellation module can be configured as the Tx and Rx pathways of the IDU and/or ODU with respect to the common pathway.

12 Claims, 10 Drawing Sheets

ISOLATION REQUIREMENT MITIGATION FOR IDU-ODU INTERCONNECTIONS IN MICROWAVE SYSTEMS

CROSS REFERENCE TO RELATED APPLICATIONS

This patent application claims the benefit of U.S. Provisional Patent Application No. 61/910,639, filed Dec. 2, 2013, entitled "Isolation Requirement Mitigation For IDU-ODU Interconnections In Microwave Systems," which is incorporated herein by reference in its entirety.

BACKGROUND

1. Field

This application relates generally to microwave backhaul architecture, including the isolation of indoor unit (IDU)-outdoor unit (ODU) interconnections in a split microwave backhaul architecture.

2. Related Art

Conventional microwave backhaul architectures are generally implemented as either a split outdoor unit (split ODU) configuration or an all outdoor unit (all ODU) configuration. Conventional split ODU configurations are generally comprised of both an indoor unit (IDU) and an outdoor unit (ODU), where the IDU and the ODU are connected over a coaxial interconnect. The IDU in a conventional split ODU configuration typically includes a modem, a digital-to-analog converter and a baseband-to-intermediate frequency converter. Under normal operation, these conventional split ODU configurations generally involve transmitting an analog signal, at an intermediate frequency, over the coaxial interconnect between the IDU and the ODU.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

The embodiments of the present disclosure will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

For purposes of this discussion, the term "module" shall be understood to include one of software, firmware, hardware (such as circuits, microchips, processors, or devices, or any combination thereof), or any combination thereof. In addition, it will be understood that each module can include one, or more than one, component within an actual device, and each component that forms a part of the described module can function either cooperatively or independently of any other component forming a part of the module. Conversely, multiple modules described herein can represent a single component within an actual device. Further, components within a module can be in a single device or distributed among multiple devices in a wired or wireless manner.

As described in detail herein, exemplary embodiments of split microwave backhaul systems can be configured to reduce interference between received and transmitted signals within an IDU and/or ODU and/or reduce one or more rejection requirements from the N-plexer.

Figure 1:
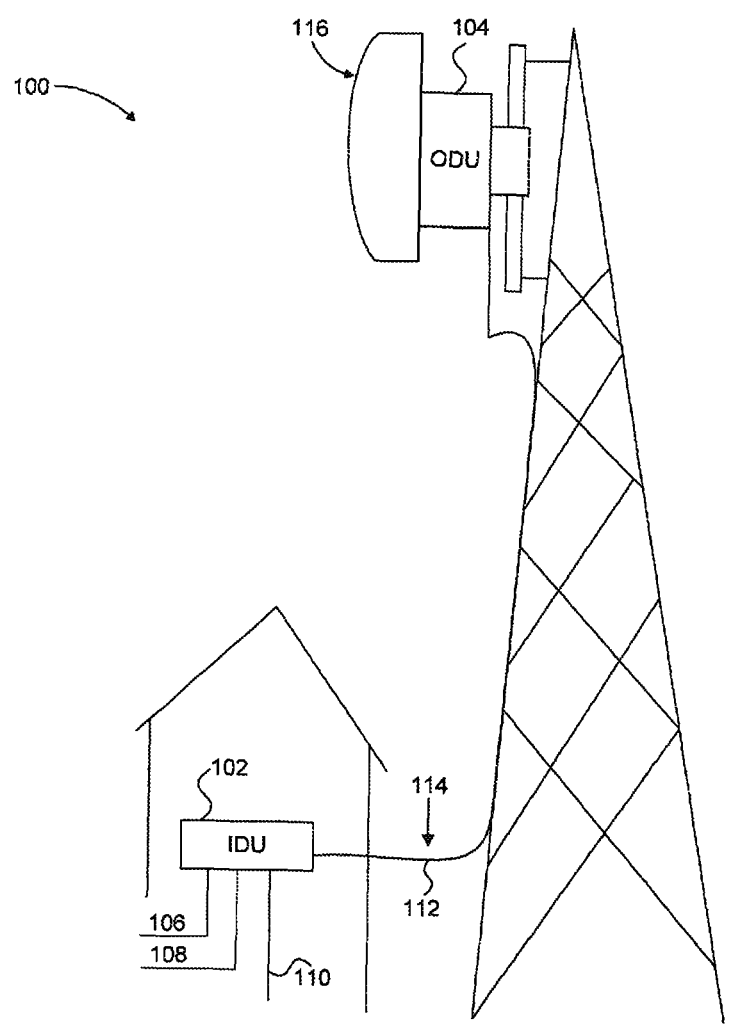
FIG. 1 illustrates a conventional split microwave backhaul system.

FIG. 1 illustrates a split microwave backhaul system 100 according to an exemplary embodiment of the present disclosure. The split microwave backhaul system 100 that includes an indoor communication unit (IDU) 102 and an outdoor communication unit (ODU) 104. Microwave, as used throughout this disclosure, refers to terrestrial point-to-point radio communications, point-to-multipoint communications and/or an interconnection between satellite communication devices to provide some examples. Further, microwave communications as described herein can be implemented in one or more other well-known communication schemes or technologies as will be understood by one of ordinary skill in the relevant art(s) without departing from the spirit or scope of the present disclosure.

Split microwave backhaul system 100 initiates communication by accessing an information source, which may comprise, for example, audio data 106, video data 108, or any other data capable of being transmitted over a connection 110. The connection 110 can be a high-capacity IP/Ethernet connection, an E-carrier connection, or any other well-known connection technology as will be understood by those skilled in the relevant art(s). To facilitate this communication, IDU 102 is electrically connected to a core network. In particular, IDU 102 is configured to acquire one or more sequences of digital data (e.g., audio data 106, video data 108, data transmitted over a high capacity IP/Ethernet connection 110, or the like) from the core network. IDU 102 may also be configured to support several additional services, such as Ethernet, and control data that is aggregated over a radio link to provide some examples.

IDU 102 may be implemented at a location that is substantially removed from ODU 104, such as at a location at ground level. For example, IDU 102 may be positioned inside of a home or an office building, or the like. Conversely, ODU 104 may be implemented at a substantially elevated location, such as on top of a pole, on top of an antenna tower, or on top of a building. In some embodiments, IDU 102 and ODU 104 may be separated by a distance up to approximately 300 meters. However, the distance of separation is not limited to this exemplary range and can be any distance as will be apparent to those skilled in the relevant arts without departing from the spirit and scope of the present disclosure.

IDU 102 and ODU 104 are connected via a bi-directional communication pathway 112, which is configured such that two analog signals 114 may be transmitted on the same cable (e.g., communication pathway 112) from one side (IDU 102) to the other (ODU 104) and back. The analog signal 114 may contain any type of data. The communication pathway 112 may include, for example, a coaxial cable, a shielding cable, a fiber optic cable, one or more copper wires, or any other cable and/or transmission technology as will be apparent to those skilled in the relevant arts without departing from the spirit and scope of the present disclosure. In some embodiments, the communication pathway 112 may be a wireless communication channel configured to utilize one or more well-known wireless communication protocols. Additionally, an antenna 116 may be electrically connected to ODU 104, and may be positioned substantially close to ODU 104. Therefore, split microwave backhaul system 100 is implemented such that data 114 may be transmitted from IDU 102, across the communication pathway 112, to the ODU 104, and subsequently to the antenna 116, where communication over a wireless link may then be initiated. Split microwave backhaul system 100 also is implemented such that data 114 received by the antenna 116 may be transmitted from the ODU 104 over the same communication pathway 112 to the IDU 102.

Although this and other exemplary embodiments are described in terms of wired backhaul architecture, those skilled in the relevant art(s) will recognize that the present disclosure may be applicable to other architectures that use wireless or other wired communication methods without departing from the spirit and scope of the present disclosure.

Figure 2A:
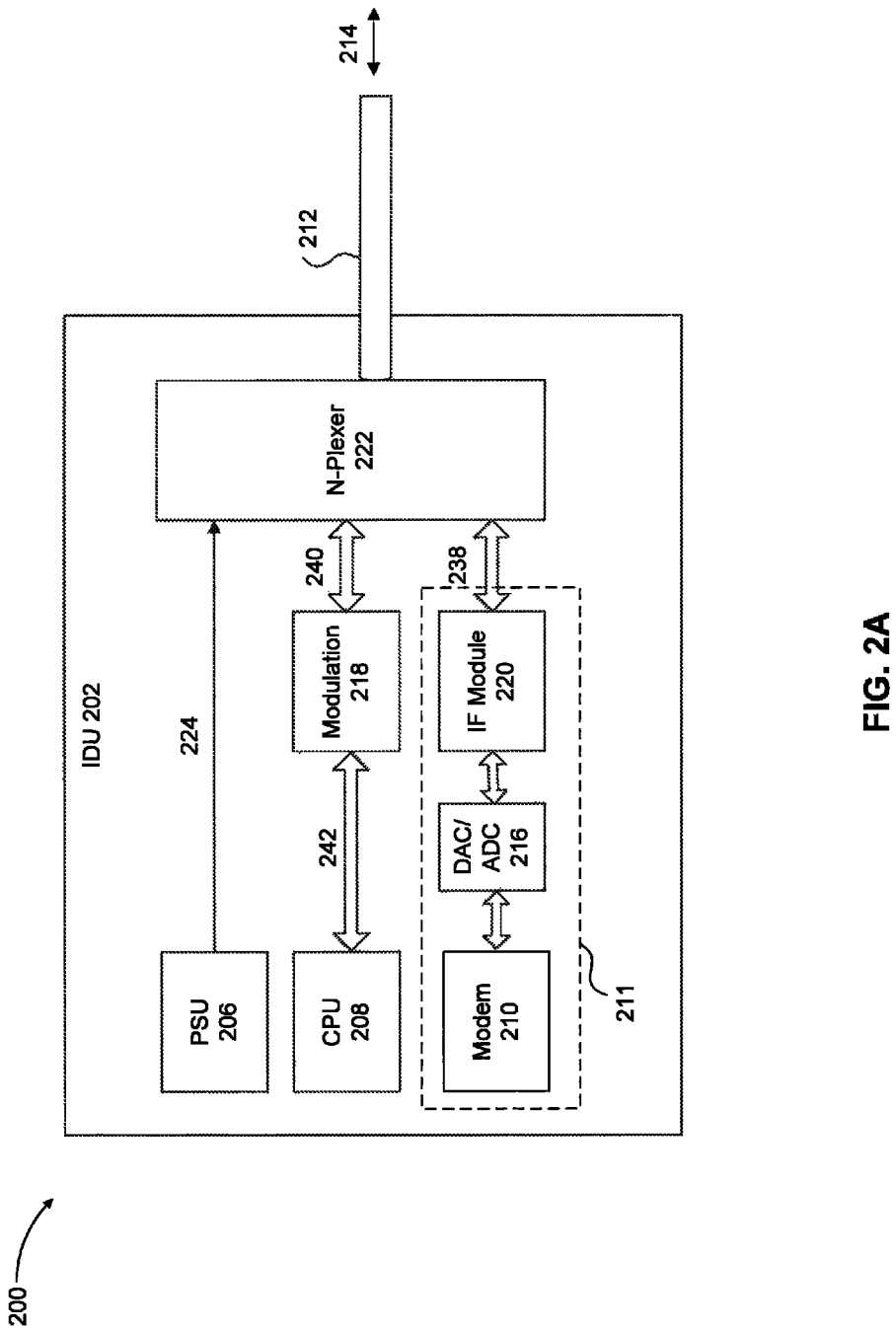
FIG. 2A illustrates a block diagram of an indoor unit (IDU) of a split microwave backhaul system according to an exemplary embodiment of the present disclosure.
Figure 2B:
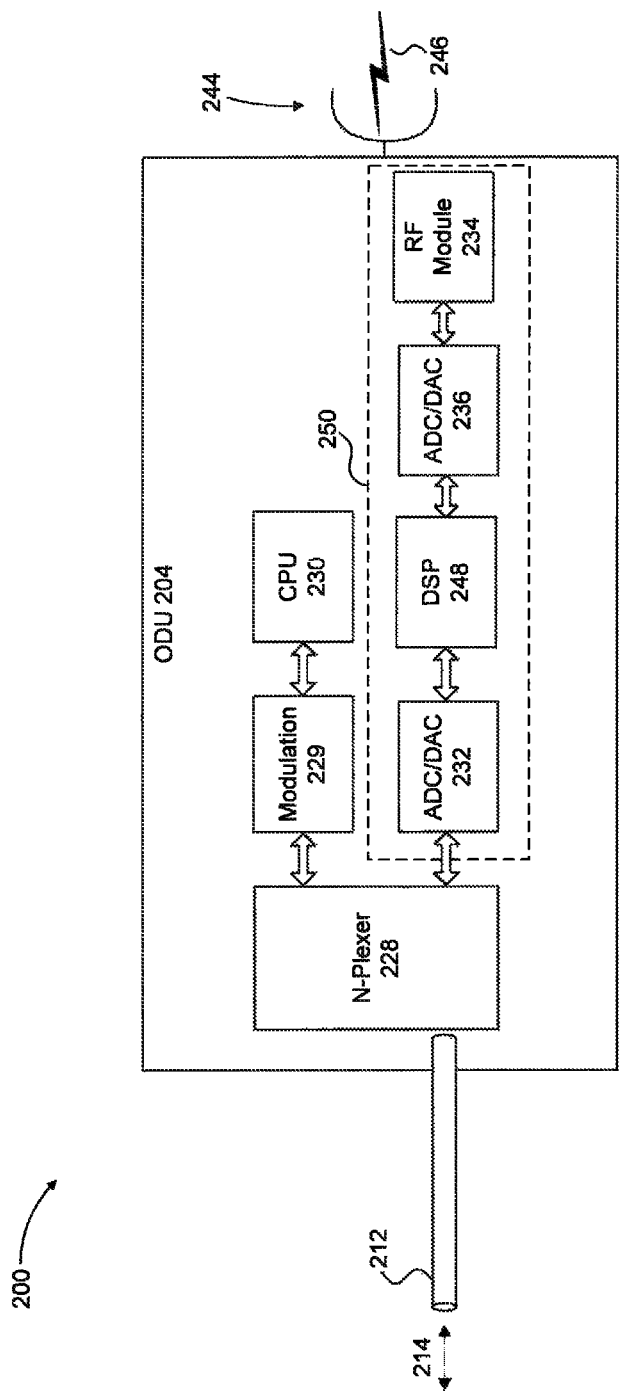
FIG. 2B illustrates a block diagram of an outdoor unit (ODU) of a split microwave backhaul system according to an exemplary embodiment of the present disclosure.

FIGS. 2A-B illustrate block diagrams of a split microwave backhaul system 200 according to an exemplary embodiment of the present disclosure. The system 200 includes an indoor communications unit (IDU) 202 coupled via a communications pathway 212 to an outdoor communications unit (ODU) 204. IDU 202 may represent an exemplary embodiment of IDU 102, and ODU 204 may represent an exemplary embodiment of ODU 104.

The IDU 202 includes a power supply unit (PSU) 206, a CPU 208, a modem 210, a digital-to-analog converter/analog-to-digital converter (DAC/ADC) module 216, a modulation module 218, an intermediate frequency (IF) module 220 and an N-plexer 222. For the purposes of this disclosure, the modem 210, DAC/ADC module 216 and IF module 220 can collectively be referred to as the modem assembly 211.

As illustrated in FIG. 2A, the PSU 206 includes suitable logic, circuitry, and/or code that is configured to produce a direct current (DC) output voltage 224. Although FIG. 2A only illustrates the PSU 206 providing the DC output voltage 224 to the N-plexer 222, the PSU 206 can also be configured to provide the DC output voltage 224 to one or more other components of the IDU 202.

The CPU 208 includes suitable logic, circuitry, and/or code that is configured to carry out instructions to perform arithmetical, logical, and/or input/output (I/O) operations of one or more of the aforementioned components within the IDU 202. In an exemplary embodiment, the CPU 208 is configured to control the operation of modulation block 218 and N-Plexer 222.

Modem 210 includes suitable logic, circuitry, and/or code that is configured to perform modulation and demodulation of data 214 that is to be transmitted between IDU 202 and ODU 204. In some exemplary embodiments, the modem 210 can function substantially similar to a baseband modem. Further, the modem 210 can be configured to cancel out noise associated with IDU 202 or communication pathway 212.

The DAC/ADC module 216 includes suitable logic, circuitry, and/or code that is configured to transmit and/or receive data from modem 210 and to perform digital-to-analog and/or analog-to-digital conversions of data 214 such that data 214 is suitable for transmission over communication pathway 212.

Modulation module 218 includes suitable logic, circuitry, and/or code that is configured to perform one or more well-known modulation and/or demodulation techniques (e.g., amplitude-shift keying) on signal 242 received from and/or transmitted to the CPU 208, and/or on signal 240 transmitted to and/or received from N-plexer 222. For example, the modulation module 218 can be configured to perform amplitude-shift keying by utilizing a finite number of amplitudes, where each amplitude is assigned a unique pattern of binary digits. Each pattern can then be configured to form the specific symbol that is represented by the particular amplitude. Additionally, when the modulation module 218 is configured to perform demodulation, the modulation module 218 can be configured to determine the amplitude of the received signal and map it back to the symbol it represents, thus recovering the original data.

The IF module 220 includes suitable logic, circuitry, and/or code that is configured to transmit and/or receive data from the DAC/ADC module 216, and to perform one or more frequency conversions of the received data such that data 214 is suitable for transmission over communication pathway 212. For example, the IF module 220 can be configured to convert data 214 from baseband (BB), or near BB, to IF.

The N-plexer 222 includes suitable logic, circuitry, and/or code that is configured to allow multi-directional (multiplex) communication over a single path (e.g., communication pathway 212) to/from two devices (e.g., IDU 202 and ODU 204). That is, the N-plexer 222 is configured to permit N-directional communications over communication pathway 212 and to isolate the IDU 202 transmission signal from a signal received from the ODU 204. The N-plexer 222 may also be configured to receive DC output voltage 224 from PSU 206, to receive a control signal 240 (e.g., a Telemetry ASK signal) output from modulation module 218, and to receive an IF signal 238 output from the IF module 220. Additionally, N-plexer 222 can be configured to convert and/or combine each of these inputs to form data 214. N-plexer 222 is also configured to transmit and/or receive data 214, over communication pathway 212, between IDU 202 and ODU 204.

In an exemplary embodiment, the communication pathway 212 can include one or more links (e.g., pathways) and be configured to permit transmission of approximately four different signals between the IDU 202 and ODU 204. However, one of ordinary skill in the relevant art(s) will understand that the transmissions of more or less signals are possible between the IDU 202 and ODU 204. For example, communication pathway 212 can be configured to transmit a transmission communication signal (TX), a receipt communication signal (RX), an up control signal, and a down control signal on the same communication pathway 212. Additionally, or alternatively, communication pathway 212 can be configured to allow TX, RX, a Telemetry ASK signal (output from modulation module 218) and DC output voltage 224 to coexist on the communication pathway 212. In an exemplary embodiment, the communication pathway 212 can represent an IF cable, and thus the conversion to the analog domain of these signals can be performed at IDU 202 (e.g., by DAC/ADC module 216).

As illustrated in FIG. 2B, ODU 204 includes an N-plexer 228, a CPU 230, ADC/DAC modules 232 and 236, a digital signal processor (DSP) 248, a radio frequency (RF) module 234. For the purposes of this disclosure, the ADC/DAC modules 232 and 236, DSP 248, and RF module 234 can collectively be referred to as the IF-to-RF module 250.

The N-plexer 228 includes suitable logic, circuitry, and/or code that is configured to allow multi-directional (multiplex) communication over a single path (e.g., communication pathway 212) to/from two devices (e.g., IDU 202 and ODU 204). That is, the N-plexer 228 is configured to permit N-directional communications over communication pathway 212 and to isolate the ODU 204 from the IDU 202. In operation, the N-plexer 228 is configured to transmit and/or receive data 214, over communication pathway 212, between IDU 202 and ODU 204. The N-plexer 228 is also configured to transmit and/or receive data to and/or from the ADC/DAC module 232, and/or to receive data and/or instructions from the CPU 230. The N-plexer 228 can also be configured to provide data to the CPU 230.

The CPU 230 can be configured to function in a substantially similar manner as CPU 208. In particular, the CPU 230 includes suitable logic, circuitry, and/or code that is configured to carry out instructions to perform arithmetical, logical, and/or input/output (I/O) operations of one or more of the aforementioned components within the ODU 204. In an exemplary embodiment, the CPU 230 can be configured to control operation of the N-plexer 228. Further, the CPU 230 can be configured to control the overall operation of the ODU 204, including one or more of the aforementioned components within the ODU 204.

Modulation module 229 includes suitable logic, circuitry, and/or code that is configured to perform one or more well-known modulation and/or demodulation techniques (e.g., amplitude-shift keying) on a signal received from and/or transmitted to the CPU 230, and/or on a signal transmitted to and/or received from N-plexer 228. For example, the modulation module 229 can be configured to perform amplitude-shift keying by utilizing a finite number of amplitudes, where each amplitude is assigned a unique pattern of binary digits. Each pattern can then be configured to form the specific symbol that is represented by the particular amplitude. Additionally, when the modulation module 229 is configured to perform demodulation, the modulation module 229 can be configured to determine the amplitude of the received signal and map it back to the symbol it represents, thus recovering the original data.

The ADC/DAC module 232 can be configured to transmit and/or receive data from N-plexer 228. The ADC/DAC modules 232 and 236 each include suitable logic, circuitry, and/or code that is configured to perform analog-to-digital and/or digital-to-analog conversions of data 214 such that the data 214 can be properly transmitted and/or received over wireless link 246 via antenna 244.

The DSP 248 includes suitable logic, circuitry, and/or code that is configured to preform one or more well-known mathematical manipulation techniques on data 214, such that data 214 may be modified or improved according to a desired processing method. For example, the DSP 248 can be configured to measure, filter, and/or compress data 214 prior to being output to ADC/DAC module 236, such that error detection and/or error correction can be performed on the data 214. In an exemplary embodiment, after data 214 is received via the communication pathway 212 by the ODU 204, the data 214 traverses through N-plexer 228, to the ADC/DAC module 232, to the DSP 248, to the ADC/DAC module 236, to the RF module 234 and to the antenna 244 before being transmitted across the wireless link 246. Similarly, after data 214 is received, over the wireless link 246 by the ODU 204, the data 214 traverses from the antenna 244 to the RF module 234, to the ADC/DAC module 236, to the DSP 248, to the ADC/DAC module 232, and to the N-plexer 228 before being transmitted over communication pathway 212 to the IDU 202.

The RF module 234 includes suitable logic, circuitry, and/or code that is configured to transmit and/or receive data from ADC/DAC module 236, and to perform one or more frequency conversions of data 214 such that the data 214 can be properly communicated over the wireless link 246. For example, when the data 214 is received at RF module 234, the data 214 can have a frequency residing in the IF range. Therefore, the RF module 234 can be configured to up-convert data 214 from IF to RF such that the data 214 can then be communicated over the wireless link 246. The RF module 234 can also be configured to down-convert a signal received over the wireless link 246 from RF to IF such that the received signal can be transmitted over the communication pathway 212 to IDU 202.

In an exemplary embodiment, the communication pathway 212 can be configured as a digital communication pathway. As a digital communication pathway, the communication pathway 212 can be configured to operate as a frequency shared pathway, such that a transmission signal and a reception signal may travel over the single digital communication pathway 212. For example, the digital communication pathway 212 may be configured to support frequency-division duplexing (FDD) and/or any other well-known communication scheme without departing from the spirit and scope of the present disclosure.

Figure 3A:
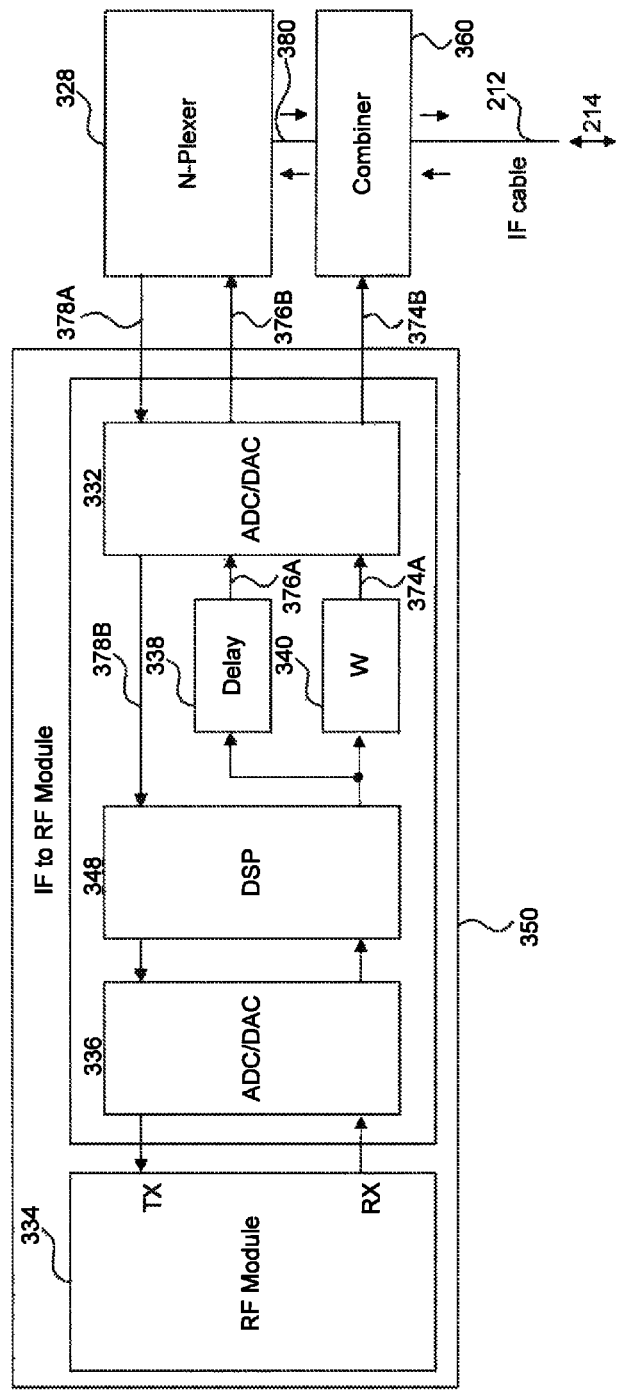
FIG. 3A illustrates a block diagram of an outdoor unit (ODU) of a split microwave backhaul system according to an exemplary embodiment of the present disclosure.
Figure 3B:
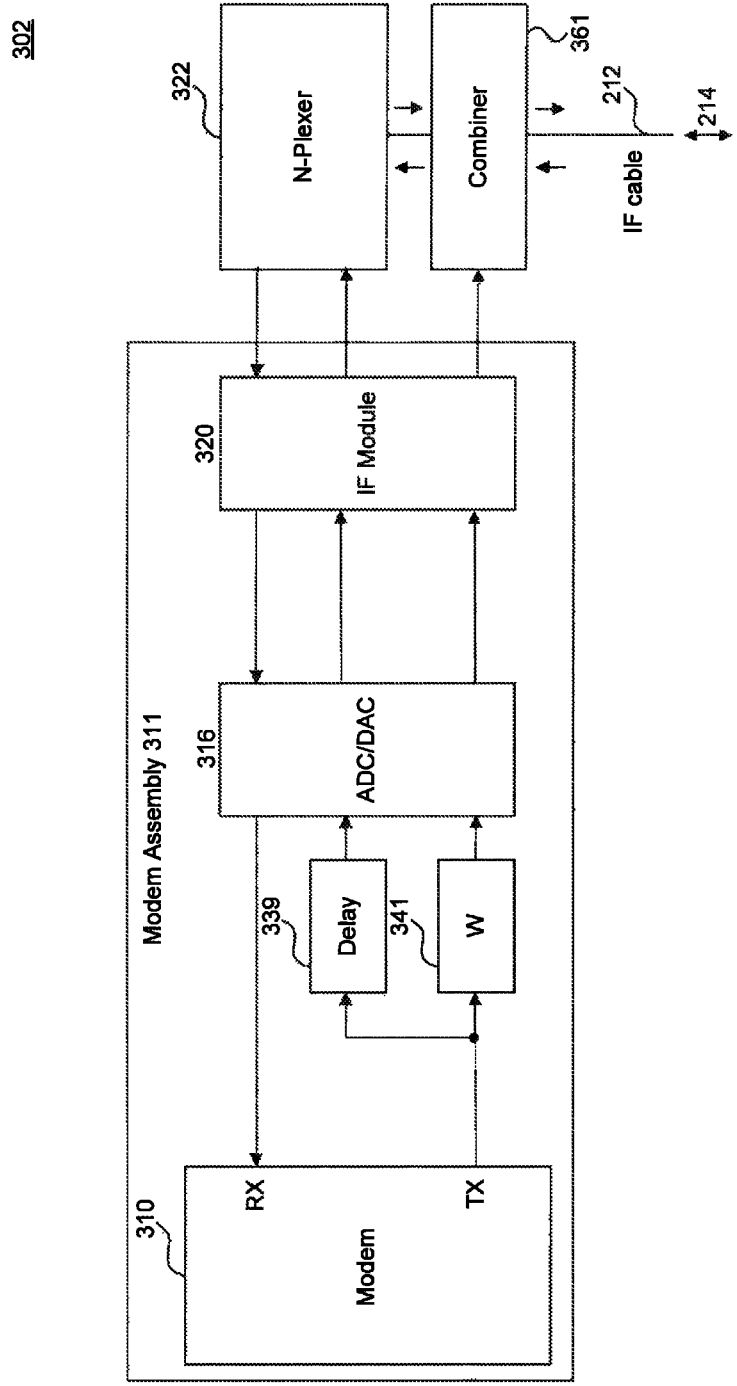
FIG. 3B illustrates a block diagram of an indoor unit (IDU) of a split microwave backhaul system according to an exemplary embodiment of the present disclosure.

FIG. 3A illustrates a block diagram of an outdoor communication unit (ODU) 304 according to exemplary embodiments of the present disclosure. The ODU 304 is coupled to, for example, indoor communications unit (IDU) 202 (or IDU 302 described below) via communications pathway 212. The ODU 304 may represent an exemplary embodiment of ODU 104 and/or ODU 204. Further, the ODU 304 shares many common elements and features with the ODU 104 described with reference to FIG. 1 and the ODU 204 described with reference to FIG. 2B. Common elements and features, among others, may not be repeated here for brevity. Further, it should be appreciated that the features and operations of the ODU 304 can be similarly implemented within an IDU. For example, as discussed with reference to FIG. 3B, the IDU 102 and/or the IDU 202 can be similarly implemented in an indoor unit (IDU) 302 according to exemplary embodiments of the present disclosure. In particular, the IDU 302 can be coupled to an indoor unit (ODU) (e.g., ODU 104, 204, 304) via communications pathway 212. The IDU 302 may represent an exemplary embodiment of IDU 102 and/or IDU 202.

Returning to FIG. 3A, the ODU 304 includes an N-plexer 328, ADC/DAC modules 332 and 336, a digital signal processor (DSP) 348, an RF module 334, a delay module 338, a W filter module 340, and a combiner 360. For the purposes of this disclosure, the ADC/DAC modules 332 and 336, delay module 338, W filter module 340, DSP 348, and RF module 334 can collectively be referred to as the IF-to-RF module 350. Similarly, with reference to FIG. 3B, an exemplary embodiment of the IDU 302 can include an N-plexer 322, a delay module 339, a W filter module 341, and a combiner 361 that share various elements and features with N-plexer 328, delay module 338, W filter module 340, and combiner 360, respectively, of the exemplary embodiment illustrated in FIG. 3A. Here, the delay module 339 and W filter module 341 are included in modem assembly 311, which is similar to the modem assembly 211 of FIG. 2A. Because of the common elements and features, and the similar operation of the IDU 302 with respect to the ODU 304, detailed discussion of the IDU 302 has been omitted for brevity.

With continued reference to FIG. 3A, the combiner 360 includes suitable logic, circuitry, and/or code that is configured to combine (e.g., mix) two or more signals together (e.g., two or more IF signals) and provide the combined signal to the third port. The combiner 360 can also be configured to transmit and/or receive data 214 via the communications pathway 212. The communication pathway 212 can be, for example, an IF cable. Further, the combiner 360 can be configured to transmit and/or receive data to and/or from the N-plexer 328, received data from the ADC/DAC module 332 of the IF-to-RF module 350, or a combination of both.

In an exemplary embodiment, for outbound data (e.g., data transmitted via the wireless link 246), the combiner 360 is configured to receive one or more IF data signals from the IF-to-RF module 350 (via signal path 374B) and data 214 from the communications pathway 212, and to combine the received IF data signals with the received data 214. The combiner 360 can also be configured to provide the combined data (e.g., data 214+IF data signals received via signal path 374B) to the N-plexer 328 (via signal path 380). Here, the IF data signals received via signal path 374B corresponds to the output of the W filter module 340 (via signal path 374A) that has been digital-to-analog converted by the ADC/DAC module 332.

For inbound data (e.g., data received by the ODU 304 via the wireless link 246 and transmitted to the IDU 200 via the communication pathway 214), the combiner 350 is configured to receive one or more IF data signals from the N-plexer 328 (via signal path 380) and provide the received IF data signals to the IDU 200 via the communication pathway 212.

The N-plexer 328 is similar to the N-plexer 228 of FIG. 2B and includes suitable logic, circuitry, and/or code that is configured to allow multi-directional (multiplex) communication over a single path to/from two devices. In operation, the N-plexer 328 is configured to transmit and/or receive data 214, over communication pathway 212. The N-plexer 328 is also configured to transmit and/or receive data to and/or from the ADC/DAC module 332 via communication pathways 378A and 378B, respectively, and to and/or from the combiner 360 via the communication pathway 380. In an exemplary embodiment, the N-plexer 328 includes one or more well-known filters and/or isolators configured to multiplex data received from the IF-to-RF module 350 and data transmitted to the IF-to-RF module 350 over the communication pathway 212. In an exemplary embodiment, the N-plexer 328 can be configured as a 2:1 splitter. Operation of the N-plexer 328 and the combiner 360 will be described in detail below with reference to FIG. 4C.

Figure 4A:
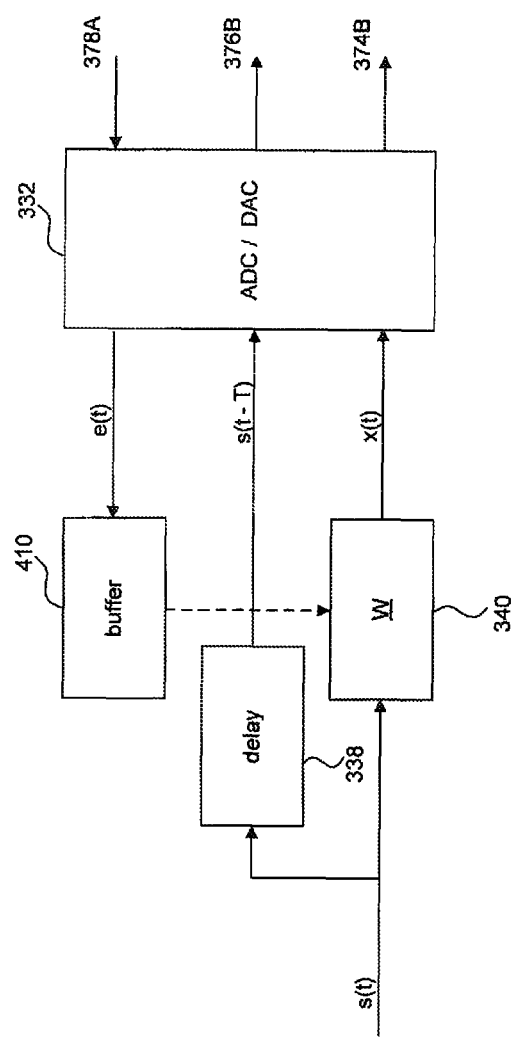
FIG. 4A illustrates a block diagram of an outdoor unit (ODU) of a split microwave backhaul system according to an exemplary embodiment of the present disclosure.
Figure 4B:
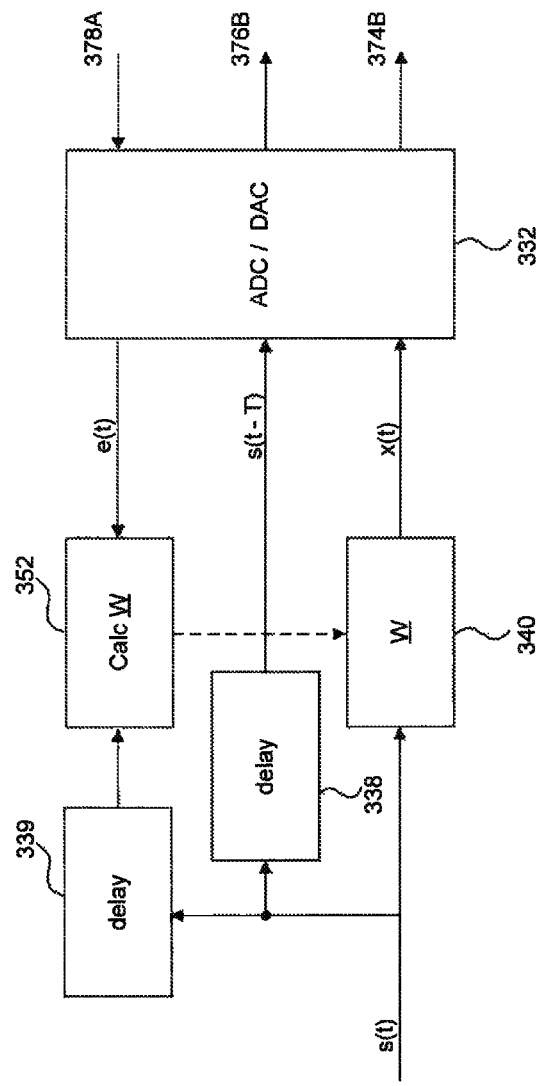
FIG. 4B illustrates a block diagram of an outdoor unit (ODU) of a split microwave backhaul system according to an exemplary embodiment of the present disclosure.

The W filter module 340 includes suitable logic, circuitry, and/or code that is configured to filter IF data signals received from the DSP 348 and provide a filtered signal to the ADC/DAC module 332 via the communication pathway 374A. In an exemplary embodiment, the W filter module 340 is configured to adaptively filter received data signals. In operation, the W filter module 340 can be calibrated prior to use, or can be configured as an adaptive filter that adaptively adjusts filtering during use, or a combination of both. The calibration and adaptive filter implementations are discussed below in detail with reference to FIGS. 4A and 4B. Although the calibration and adaptive filter implementations illustrated in FIGS. 4A and 4B are with respect to an ODU implementation, it will be appreciated by those skilled in the relevant art(s) that such implementations can similarly be implemented in an IDU. Here, the discussion with respect to an IDU implementation has been omitted for brevity.

Figure 4C:
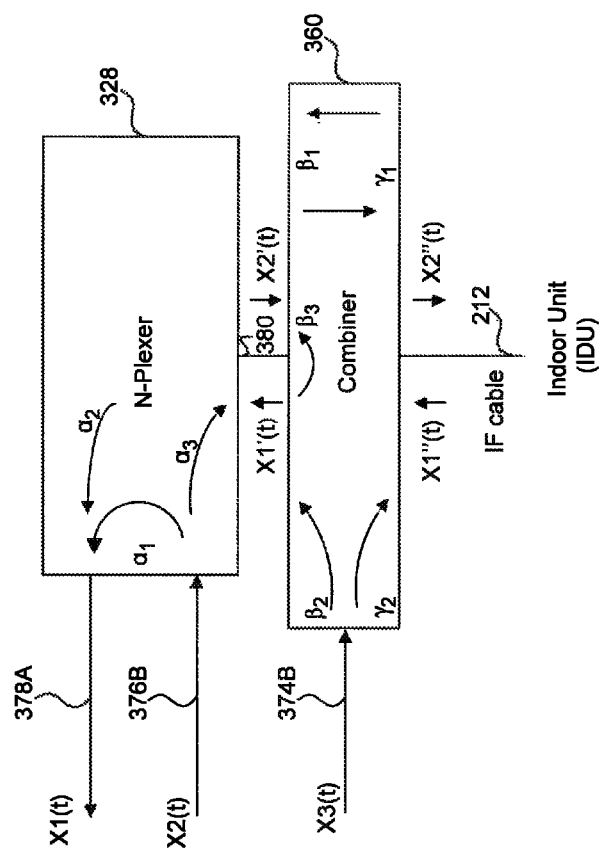
FIG. 4C illustrates a block diagram of an N-plexer and combiner according to an exemplary embodiment of the present disclosure.

In an exemplary embodiment, the W filter module 340 is configured to generate a filtered output signal (e.g., x(t) in FIGS. 4A-4C) that has the same (or substantially the same) amplitude and/or is 180 degrees out of phase of one or more portions of the signal received by the N-plexer 328 via the communication pathway 376B that are not isolated from the signal received via the N-plexer 328 via communication pathway 380. That is, the W filter module 340 is configured to generate a cancellation signal (e.g., $X3(t)$ in FIG. 4C) that, when combined (by combiner 360) with an outbound signal (e.g., $X1''(t)$), cancels out (e.g., cause destructive interference with) one or more portions of the inbound signal (e.g., $X2(t)$) that are not isolated from the outbound signal by the N-plexer 328. As a result, the signal provided to the IF-to-RF module 350 by the N-plexer 328 (e.g., signal $X1(t)$ via communication pathway 378A) is equivalent (or substantially equivalent) to the outbound signal (e.g., signal 214) provided to the ODU 304 by the IDU 302 regardless of isolation deficiencies of the N-plexer 328.

FIG. 4A illustrates an example calibration configuration of the W filter module 340 according to an exemplary embodiment of the present disclosure. For calibration, the IF-to-RF module 350 employs a buffer 410 that includes suitable logic, circuitry, and/or code that is configured to store the IF data signals received from the ADC/DAC module 332 via the communication pathway 378A and to use the stored IF data signal to calculate the filter coefficients and/or parameters for the W filter module 340, which are then provided to the W filter module 340 by the buffer 410.

During calibration, the calibration signal s(t) is first provided to the W filter module 340 and then to the delay module 338. Here, in the first stage, the W filter module 340 is configured as a delta (i.e., bypass) filter so as to delay the calibration signal s(t) without filtering the calibration signal s(t) and the received signal is stored in the buffer (as signal $S_b$). In the second stage, the delay is configured to zero delay (i.e., bypass) and the received signal is stored in the buffer (as signal $S_a$). The two stored signals in the buffer (signals $S_a$ and $S_b$) are later used to calculate the W filter coefficients as discussed in more detail below. In operation, the delay module 338 and the W filter module 340 delay the input calibration signal s(t) to generate signals s(t−T) and x(t) that are provided to the ADC/DAC module 332 via communication pathways 376B and 374B, respectively. Following DAC conversion by the ADC/DAC module 332, these signals are then provided to the N-plexer 328 and combiner 360 via communication pathways 376B and 374B, respectively. The IF data signal e(t) received by the ADC/DAC module 332 from the N-plexer 328 via the communication pathway 378A represents the portions of signals s(t−T) and x(t) that have not been isolated from the transmission signal (e.g., the outbound (i.e., Tx) signal received via the communication pathway 212 from the DU 202 and passed to the IF-to-RF module 350 via communication pathway 378A) by the N-plexer 328 and combiner 360, respectively. That is, e(t) represents the one or more portions of the received IF signals (e.g., inbound (i.e., Rx) signals provided by RF module 348) that interfere with the outbound IF data signals (e.g., outbound signals from the IDU 202) passing through the combiner 360 and N-plexer 328 on their way to the RF module 334 to be transmitted (e.g., as Tx signals).

Based on this configuration, the filter coefficients W of the W filter module 340 can be determined using the following equation:

$$\underline{W} = -\operatorname*{argmin}_{H}\|\underline{S}_b^T \underline{H} - \underline{S}_a\|^2 = -(\underline{S}_b^T \underline{S}_b)^{-1} \cdot \underline{S}_b^T \underline{S}_a = -pinv(\underline{S}_b) \cdot \underline{S}_a$$

Here, W is a vector of filter coefficients for the W filter module 340, $S_a$ is a vector of the signals s(t−T) received from the N-plexer 328 via communication pathway 378A, and $S_b$ is a matrix of the signals x(t) received from the N-plexer 328 via communication pathway 378A. Any delay in filter module W 340 can be replaced with a configured delay in the delay module 338.

FIG. 4B illustrates an example adaptive filter configuration of the W filter module 340 according to an exemplary embodiment of the present disclosure. The adaptive filter configuration shares many common elements, features, and operations with the calibration configuration described with reference to FIG. 4A. Common elements, features, and operations, among others, may not be repeated here for brevity.

In an adaptive filtering configuration, the IF-to-RF module 350 includes filter coefficient calculation module 352 having suitable logic, circuitry, and/or code that is configured to adaptively calculate filter coefficients for the W filter module 340 based on a received input signal (e.g., s(t)) and error signal (e.g., e(t)) using an adaptive algorithm. In an exemplary embodiment, the adaptive algorithm is for example, a least-mean-squares (LMS) algorithm. However, the adaptive algorithm is not limited to LMS, and can be any adaptive filter algorithm as will be apparent to those skilled in the relevant arts without departing from the spirit and scope of the present disclosure.

The filter coefficient calculation module 352 is configured to receive a delayed input signal s(t) having been delayed by delay module 339 and the error signal e(t) received from the ADC/DAC module 332. The delay module 339 is similar to the delay module 338. As discussed above, the IF data signal e(t) received by the ADC/DAC module 332 from the N-plexer 328 via the communication pathway 378A represents the portions of signals s(t−T) and x(t) that have not been isolated from the transmission signal (e.g., the Tx signal received via the communication pathway 212 from the IDU 202 and passed to the IF-to-RF module 350 via communication pathway 378A) by the N-plexer 328 and combiner 360, respectively.

In operation, the filter coefficient calculation module 352 is configured to adaptively adjust the filter coefficients W of the W filter module 340 so as to minimize the error signal e(t). An example adaptive algorithm is shown in the following equation 2:

$$W_i(t) = W_i(t-1) - \mu_i e(t) \cdot s(t-T-i)$$

Here, i is the filter coefficient number of the filter coefficients W and μ is the adaptation factor. The adaptation factor may be a constant or can vary for one or more of the filter coefficients. T is the delay introduced by the delay module 338.

FIG. 4C illustrates the operation of the N-plexer 328 and the combiner 360 according to an exemplary embodiment of the present disclosure. Here, the operation of the N-plexer 328 and the combiner 360 is with respect to an ODU implementation. However, as discussed above, N-plexer 322 and combiner 361 within an IDU implementation share various features with N-plexer 328 and combiner 360, as well as are configured to operate in a similar manner. Therefore, discussion of the operation of the IDU implementation has been omitted for brevity.

In an exemplary embodiment, the ODU 304 includes the combiner 360 to reduce and/or eliminate interference of the signal X2(t) (e.g., inbound signal) on signal X1(t) (e.g., outbound signal) which is caused by the isolation of signals by the N-plexer 328. The combiner 360 can be, for example, an RF passive element that produces the following relationships between the various inputs/outputs:

$$X1'(t) = \beta_1 X1''(t) - \beta_2 X3(t)$$

$$X2''(t) = \gamma_1 X2'(t) - \gamma_2 X3(t)$$

Here, $\beta_1$, $\beta_2$, $\gamma_1$, and $\gamma_2$ define the proportional relationships between the input signal X3(t) and each of the input signals X1''(t) and X2'(t). With regards to the N-plexer 328, $\alpha_1$ is the isolation between X1(t) and X2(t), $\alpha_2$ is the loss in the N-plexer between X1'(t) and X1(t), and $\alpha_3$ is the loss in the N-plexer between X2(t) and X2'(t). In an exemplary embodiment, the isolation and losses are the isolation and losses at a constant frequency.

As described above with respect to the determination of the filter coefficients of the W filter module 340, the input signal X3(t) is determined so as to minimize and/or eliminate the interference of X2(t) on X1(t). That is, the input signal X3(t) is chosen so as to satisfy X3(t)=−δ·X2(t), where δ is equal to the isolation of X2(t) to X1(t). In determining the filter coefficients, the value of δ is chosen with consideration of the losses through the N-plexer 328 and the combiner 360 so as to avoid destructive interference to the IDU 302. That is, consideration is given so that the sum of δ and the N-plexer 328 and combiner 360 losses does not equal the transfer between the N-plexer 328 and the combiner 360 (e.g., between X2(t) and X2''(t)). For example, when considering the losses through the N-plexer 328, the following relationships exist:

$$X2'(t) = \alpha_3 X2(t) + \tau$$

$$X1(t) = \alpha_2 X1'(t) + \alpha_1 X2(t)$$

Here, τ is the return loss through the N-plexer 328. This return loss can be ignored. With regards to the combiner 360, the following relationships exist:

$$X1'(t) = \beta_1 X1''(t) + \beta_2 X3(t) + \beta_3 X2'(t)$$

$$X2''(t) = \gamma_1 X2'(t) + \gamma_2 X3(t) + \omega$$

Here, ω is the return loss through the combiner 360. This return loss can be ignored. With the N-plexer 328 and combiner 360 relationships above, the transfer between the N-plexer 328 and the combiner 360 (e.g., between X2(t) and X2"(t)) can be solved for as shown below:

$$X1(t) = \alpha_2 X1'(t) + \alpha_1 X2(t)$$
$$= \alpha_2\beta_1 X1''(t) + \alpha_2\beta_2 X3(t) +$$
$$\alpha_2\beta_3 X2'(t) + \alpha_1 X2(t)$$
$$= \alpha_2\beta_1 X1''(t) + \alpha_2\beta_2 X3(t) +$$
$$\alpha_2\alpha_3\beta_3 X2(t) + \alpha_1 X_2(t)$$
$$= \alpha_2\beta_1 X1''(t) + \alpha_2\beta_2 X3(t) +$$
$$(\alpha_1 + \alpha_2\alpha_3\beta_3)X2(t)$$

By selecting $X3(t) = -\frac{\alpha_1 + \alpha_2\alpha_3\beta_3}{\alpha_2\beta_2} \cdot X2(t) \xrightarrow{yields} X1(t)$ $$= \alpha_2\beta_1 X1''(t)$$

$$X2''(t) = \gamma_1 X2'(t) + \gamma_2 X3(t) = \gamma_1\alpha_3 X2(t) + \gamma_2 X3(t)$$

By again selecting $X3(t) = -\frac{\alpha_1 + \alpha_2\alpha_3\beta_3}{\alpha_2\beta_2}$.

$$X2(t) \xrightarrow{yields} X2''(t)$$
$$= \left(\gamma_1\alpha_3 - \gamma_2\frac{\alpha_1 + \alpha_2\alpha_3\beta_3}{\alpha_2\beta_2}\right)X2(t)$$

Here, to avoid the destructive interference, $$\gamma_1\alpha_3 - \gamma_2\frac{\alpha_1 + \alpha_2\alpha_3\beta_3}{\alpha_2\beta_2} \neq 0$$

In an exemplary embodiment, based on the above calculations, the filter coefficients W of the W filter module 340 are selected so as to satisfy:

$$X3(t) = \frac{\alpha_1 + \alpha_2\alpha_3\beta_3}{\alpha_2\beta_2} \cdot X2(t),$$
where $\gamma_1\alpha_3 - \gamma_2\frac{\alpha_1 + \alpha_2\alpha_3\beta_3}{\alpha_2\beta_2} \neq 0$ Here, the signal X3(t) acts as a cancellation signal that is combined, by the combiner 360, with the outbound IF data signal (e.g., signal X1"(t)) provided to the ODU 304 by the IDU 302 via the communication pathway 212.

Figure 5A:
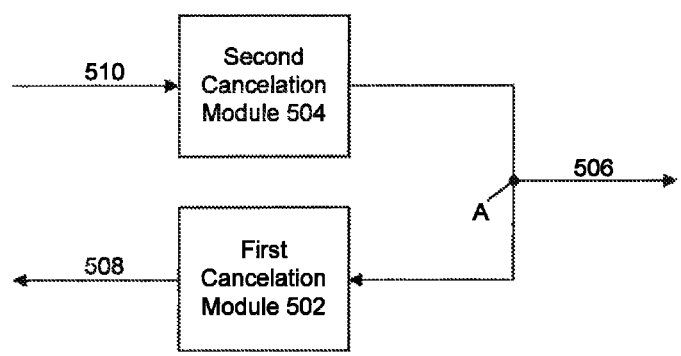
FIG. 5A illustrates a block diagram of an N-plexer according to an exemplary embodiment of the present disclosure.

FIG. 5A illustrates an N-plexer 500 according to an exemplary embodiment of the present disclosure. The N-plexer 500 may represent an exemplary embodiment of the N-plexer 222, N-plexer 228, and/or N-plexer 328.

The N-plexer 500 includes suitable logic, circuitry, and/or code that is configured to allow multi-directional (multiplex) communication over a single path (e.g., communication pathway 506) to/from two devices (e.g., IDU 202 and ODU 204, IDU 302 and ODU 304, or the like). That is, the N-plexer 500 is configured to permit N-directional communications over communication pathway 506. Here, the communication pathway 506 corresponds to the communication pathway configured to connect the two devices, and can be for example, an IF cable.

In an exemplary embodiment, the N-plexer 500 includes a first signal cancellation module 502 and a second signal cancellation module 504. The first signal cancellation module 502 is communicatively coupled to the communication pathway 506 (e.g., communication pathway 212) and to a communication pathway 508 (e.g., communication pathway 378A) configured as an output of the first signal cancellation module 502. The second signal cancellation module 504 is communicatively coupled to the communication pathway 506 and to a communication pathway 510 (e.g., communication pathway 376B) configured as an input of the second signal cancellation module 504. In an embodiment in which the N-plexer 500 is implemented in an ODU, the communication pathway 508 serves as the Tx (e.g., outbound) communication pathway to an antenna and the communication pathway 510 serves as the Rx (e.g., inbound) communication pathway from the antenna. In an embodiment in which the N-plexer 500 is implemented in an IDU, the communication pathway 508 serves as the Rx communication pathway to, for example, a core network and the communication pathway 510 serves as the Tx communication pathway from, for example, the core network.

The first signal cancellation module 502 includes suitable logic, circuitry, and/or code that is configured to filter signals received via the communication pathway 506 and provide the transmission signals to the communication pathway 508 while isolating the communication pathway 508 from signals received via the communication pathway 510. Similarly, the second signal cancellation module 504 includes suitable logic, circuitry, and/or code that is configured to pass signals received via the communication pathway 510 and provide the received signals to the communication pathway 506 while isolating the communication pathway 510 from signals received via the communication pathway 506. In an exemplary embodiment, the first and second signal cancellation modules 502 and 504 each include an amplifier (e.g., operational amplifier) and one or more passive electrical components (e.g., resistors, inductors, capacitors, etc.). An example configuration of an embodiment can include: (1) an input of the amplifier included in the second signal cancellation module 504 being communicatively coupled to the communication pathway 510 and the output of the amplifier being communicatively coupled to the communication pathway 506, and (2) an input of the amplifier included in the first signal cancellation module 502 also being communicatively coupled to the communication pathway 506 and the output of the amplifier of the second signal cancellation module 504, while the output of the amplifier of the first signal cancellation module 502 is communicatively coupled to the communication pathway 508.

Figure 5B:
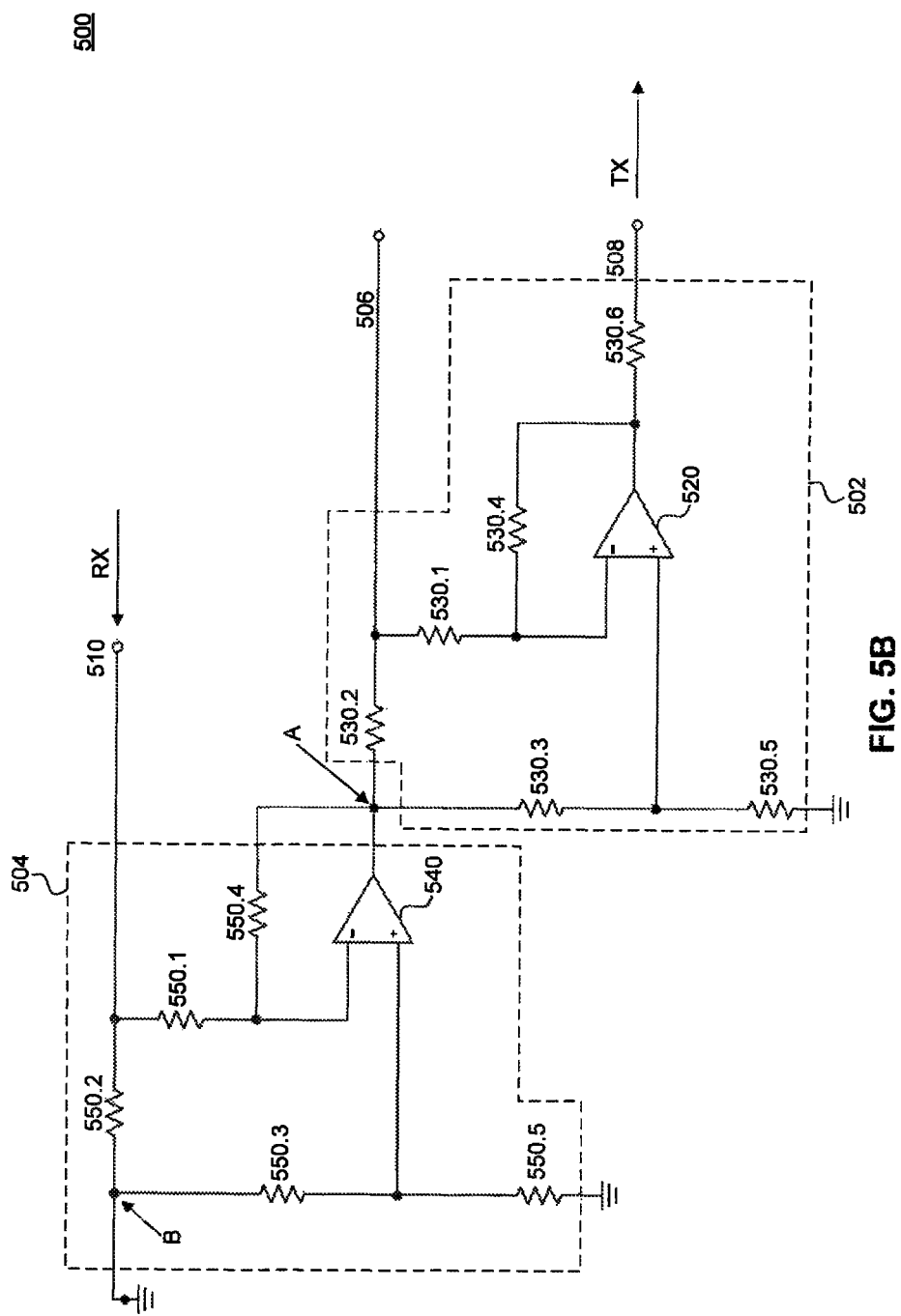
FIG. 5B illustrates a block diagram of an N-plexer according to an exemplary embodiment of the present disclosure.

In an exemplary embodiment, and as illustrated in FIG. 5B, the first signal cancellation module 502 includes an operational amplifier (op-amp) 520 and resistors 530.1 to 530.6. For example, the communication pathway 506 can be connected to the inverted input of the op-amp 520 via resistor 530.1, and connected to the non-inverted input of the op-amp 520 via resistors 530.2 and 530.3 that are connected in series. The non-inverted input of the op-amp 520 can also be connected to ground via resistor 530.5. The output of the op-amp 520 can be connected to communication pathway 508 via resistor 530.6, and connected to the non-inverted input of the op-amp 520 via resistor 530.4. In an exemplary embodiment, the op-amp 520 can be configured to have a gain of 0 dB and a bandwidth of 800 MHz. Resistors 530.1, 530.2, 530.5 and 530.6 can have a resistance of 100Ω (ohms) and resistors 530.3 and 530.4 can have a resistance of 322.6Ω. It will be appreciated that the present disclosure is not limited to these example gain, bandwidth and resistance values, and these values can be any gain, bandwidth, and resistance values as will be apparent to those of ordinary skill in the relevant arts without departing from the spirit and scope of the present disclosure.

In an exemplary embodiment, the second signal cancellation module 504 includes an op-amp 540 and resistors 550.1 to 550.5 implemented in a similar configuration as the components of the first signal cancellation module 502. For example, the op-amp 540 can be configured similar to the configuration of the op-amp 520, and resistors 550.1 to 550.5 can be configured similar to the configuration of resistors 530.1 to 530.5, respectively. Here, the op-amps 520 and 540 can have identical or substantially identical gains. However, the op-amps are not limited to having identical or substantially identical gains, and the op-amps can have any gain value as will be apparent to those of ordinary skill in the relevant arts without departing from the spirit and scope of the present disclosure.

In an example configuration, the output of the op-amp 540 is connected to node A between the resistors 530.2 and 530.3 of the first signal cancellation module 502. Further, node A can be connected to the inverted input of the op-amp 540 via resistor 550.4. The communication pathway 510 can be connected to the inverted input of the op-amp 540 via resistor 550.1, and connected to the non-inverted input of the op-amp 540 via resistors 550.2 and 550.3 that are connected in series. Node B between resistors 550.2 and 550.3 can also be connected to ground. The non-inverted input of the op-amp 540 can also be connected to ground via resistor 550.5.

In an exemplary embodiment, the an op-amp 540 and resistors 550.1 to 550.5 can be configured to have similar gain, bandwidth, and resistance values as the op-amp 520 and resistors 530.1 to 530.5 of the first signal cancellation module 502. For example, resistors 550.1 to 550.5 have resistance values equal (or substantially equal) to resistance values of resistors 530.1 to 530.5, respectively. However, it will be appreciated that these values are not limited to the values implemented in the first signal cancellation module 520. For example, the gain, bandwidth and/or resistance values can be different from or the same as those values in the first signal cancellation module 502, where the values can be any other gain, bandwidth, and/or resistance value as will be apparent to those of ordinary skill in the relevant arts without departing from the spirit and scope of the present disclosure.

In operation, the output of the second signal cancellation module 504 (e.g., the Rx signal as output of the op-amp 540) will flow to both the inverted and non-inverted inputs of the op-amp 520. The signal (e.g., all, substantially all, or a majority of the signal) received via the communication pathway 506 (e.g., IF cable) will flow to the non-inverted input of the op-amp 520. As a result, the output of the second signal cancellation module 504 is canceled out (or substantially canceled out) by the op-amp 520 of the first signal cancellation module 502 while the signal received via the communication pathway 506 is amplified by the op-amp 520 and provided to the communication pathway 508. That is, the output to the communication pathway 508 by the first signal cancellation module 502 will include signals received via the communication pathway 506 while canceling out (rejecting) signals received via the communication pathway 510. Similarly, signals received via the communication pathway 506 will be isolated from the communication pathway 510 by the op-amp 540, and will be amplified by the op-amp 520 and provided to communication pathway 508 as an outbound (e.g., Tx) signal.

CONCLUSION

The aforementioned description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments within the spirit and scope of the disclosure. Therefore, the specification is not meant to limit the invention. Rather, the scope of the invention is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventors, and thus, are not intended to limit the present invention and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

What is claimed is:

1. A communication device, comprising:
   an intermediate frequency (IF)-to-radio frequency (RF) module configured to generate a cancelation signal and a second signal;
   a combiner configured to combine the cancelation signal with an input signal to generate a combined signal; and
   an N-plexer configured to receive the combined signal and the second signal, and to generate a third signal by combining the combined signal and a portion of the second signal such that the cancelation signal included in the combined signal at least partially cancels out the portion of the second signal.

2. The communication device of claim 1, wherein the third signal substantially corresponds to the input signal.

3. The communication device of claim 1, wherein the N-plexer is configured such that the portion of the second signal interferes with the combined signal.

4. The communication device of claim 1, wherein a phase of the cancelation signal is substantially opposite of a phase of the portion of the second signal.

5. The communication device of claim 4, wherein the cancelation signal is 180° out of phase of the portion of the second signal.

6. The communication device of claim 4, wherein an amplitude of the cancelation signal is substantially equal to an amplitude of the portion of the second signal.

7. The communication device of claim 1, wherein the portion of the second signal is a non-isolated portion of the second signal with respect to the combined signal.

8. The communication device of claim 1, wherein the IF-to-RF module includes a filter module configured to generate the cancelation signal.

9. The communication device of claim 8, wherein the filter module is configured to filter a received RF signal to generate the cancelation signal.

10. The communication device of claim 8, wherein the filter module is configured to generate the cancelation signal by adaptively processing the third signal.

11. The communication device of claim 10, wherein the adaptive processing of the third signal includes least-mean-squares (LMS) processing of the third signal.

12. A communication device, comprising:
    an intermediate frequency (IF)-to-radio frequency (RF) module including:
       an digital signal processor (DSP) configured to generate a first signal; and
       a filter module configured to generate a cancelation signal based on the first signal;
    a combiner configured to combine an analog version of the cancelation signal with an input signal received by the combiner to generate a combined signal; and
    an N-plexer configured to receive the combined signal from the combiner and a second signal from the IF-to-RF module, and to generate a third signal based on the combined signal and a portion of the second signal not isolated from the combined signal by the N-plexer, wherein the analog version of the cancelation signal included in the combined signal substantially cancels out the portion of the second signal not isolated from the combined signal.

* * * * *